US010809289B2

(12) United States Patent
Abeywickrama et al.

(10) Patent No.: US 10,809,289 B2
(45) Date of Patent: Oct. 20, 2020

(54) METHOD AND DEVICE FOR DETERMINING CAPACITIVE COMPONENT PARAMETERS

(71) Applicant: ABB Schweiz AG, Baden (CH)

(72) Inventors: Nilanga Abeywickrama, Västerås (SE); Tord Bengtsson, Västerås (SE); Jonas Hedberg, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/489,519

(22) PCT Filed: Feb. 21, 2018

(86) PCT No.: PCT/EP2018/054261
§ 371 (c)(1),
(2) Date: Aug. 28, 2019

(87) PCT Pub. No.: WO2018/158122
PCT Pub. Date: Sep. 7, 2018

(65) Prior Publication Data
US 2020/0018783 A1    Jan. 16, 2020

(30) Foreign Application Priority Data

Mar. 1, 2017  (EP) ..................... 17158769

(51) Int. Cl.
*G01R 27/26* (2006.01)
*G01R 31/62* (2020.01)
*H01F 27/40* (2006.01)

(52) U.S. Cl.
CPC ..... *G01R 27/2694* (2013.01); *G01R 27/2605* (2013.01); *G01R 31/62* (2020.01); *H01F 27/402* (2013.01)

(58) Field of Classification Search
CPC ............ G01R 27/2694; G01R 27/2605; G01R 31/027; G01R 31/1245; G01R 21/006; H01F 27/402
(Continued)

(56) References Cited

U.S. PATENT DOCUMENTS 2,146,069 A * 2/1939 Higgins ................. G01R 27/18
                                                        324/552
2,484,233 A * 10/1949 Lingal .................... H01B 17/34
                                                         174/31 R
(Continued)

FOREIGN PATENT DOCUMENTS

CN    102157947 A    8/2011
CN    102539964 A    7/2012
(Continued)

OTHER PUBLICATIONS

International Preliminary Report on Patentability Application No. PCT/EP2018/054261 Completed: Jun. 12, 2019; dated Jun. 12, 2019 33 pages.
(Continued)

*Primary Examiner* — Patrick Assouad
*Assistant Examiner* — Demetrius R Pretlow
(74) *Attorney, Agent, or Firm* — Sage Patent Group

(57) ABSTRACT

A method of determining the capacitance and loss-factor of each of a plurality of capacitive components of an electrical power device, wherein the method includes: a) obtaining for each capacitive component a respective capacitance value and loss-factor value, and b) processing the capacitance values and the loss-factor values, wherein the processing involves removing a common influence of temperature on the capacitance values from the capacitance values and removing a common influence of temperature on the loss-factor values from the loss-factor values to obtain for each
(Continued)

capacitive component a temperature-compensated capacitance value and a temperature-compensated loss-factor value.

18 Claims, 2 Drawing Sheets

(58) Field of Classification Search
USPC .......................................................... 324/552
See application file for complete search history.

(56) References Cited

U.S. PATENT DOCUMENTS

| | | | | |
|---|---|---|---|---|
| 2,889,395 | A * | 6/1959 | Frakes | H01B 17/26 174/140 R |
| 3,979,581 | A | 9/1976 | Reuland | |
| 4,757,263 | A | 7/1988 | Cummings, III et al. | |
| 6,177,803 | B1 | 1/2001 | Train et al. | |
| 6,927,562 | B2 | 8/2005 | Anand et al. | |
| 2006/0259277 | A1* | 11/2006 | Fantana | G06Q 10/06 702/183 |
| 2008/0077336 | A1* | 3/2008 | Fernandes | G01R 15/142 702/57 |
| 2011/0301880 | A1* | 12/2011 | Stenestam | G05B 19/0428 702/50 |
| 2012/0036677 | A1* | 2/2012 | Chung | H01H 33/26 16/2.1 |
| 2013/0119949 | A1* | 5/2013 | Albertson | H01G 9/00 323/209 |
| 2013/0322137 | A1* | 12/2013 | Lee | H02M 7/217 363/45 |
| 2014/0012522 | A1 | 1/2014 | Colombi et al. | |
| 2014/0222355 | A1* | 8/2014 | Cheim | G05B 23/024 702/58 |
| 2016/0154051 | A1* | 6/2016 | Watson | G01R 31/1245 324/552 |
| 2016/0202303 | A1 | 7/2016 | Costa i Bricha | |

FOREIGN PATENT DOCUMENTS

| | | |
|---|---|---|
| EP | 0747715 A2 | 12/1996 |
| EP | 2986993 A1 | 2/2016 |
| EP | 3040716 A1 | 7/2016 |
| EP | 3070483 A1 | 9/2016 |
| JP | S516354 A | 1/1976 |
| JP | H0344570 A | 2/1991 |
| JP | H041579 A | 1/1992 |
| JP | 2017161362 A | 9/2017 |
| KR | 101688641 B1 | 12/2016 |
| RU | 72332 U1 | 4/2008 |
| RU | 2577803 C1 | 3/2016 |
| WO | 2008067787 A1 | 6/2008 |

OTHER PUBLICATIONS

Hui Ma et al: "Machine learning techniques for power fransformer insulation diagnonis" Universities Power Engineering Conference (AUPEC), 2011 21st Australasian, IEEE Sep. 25, 2011 pp. 1-6.
Mark F. Lachman et al: "On-line Diagnostics of High-Voltage Bushings and Current Transformers Using the Sum Current Method", IEEE Transactions on Power Delivery, IEEE Service Center, New York, NY, US. vol. 15 No. 1 Jan. 1, 2000 8 Pages.
European Search Report Application No. EP 17 15 8769 Completed: Aug. 31, 2017;dated: Nov. 17, 2017 21 pages.
International Search Report and Written Opinion of the International Searching Authority Application No. PCT/EP2018/054261 Completed: Apr. 25, 2018; dated: May 9, 2018 27 pages.
Written Opinion of the International Searching Authority Application No. PCT/EP2018/054261 dated: Feb. 21, 2019 26 pages.
Kim, Min Koo: "Advanced Impedance-based Damage Detection Considering Temperature and Loading Effects", Master Thesis, Department of Civil and Environmental Engineering, Korea Advanced Institute of Science and Technology, published Jun. 4, 2010. 96 Pages.
Korean Office Action Translation Application No. 10-2019-7026613 Completed: Dec. 3, 2019 4 Pages.
Japanese Office Action with Translation Application No. 2019-547127 Completed: Feb. 4, 2020 8 pages.
Chinese First Office Action dated Mar. 11, 2020 for Chinese Patent Application No. 2018800145539, 12 pages including English transation.
Russian Office Action dated Apr. 20, 2020 for Russian Patent Application No. 2019129500/28(058092), 15 pages including English translation.

* cited by examiner

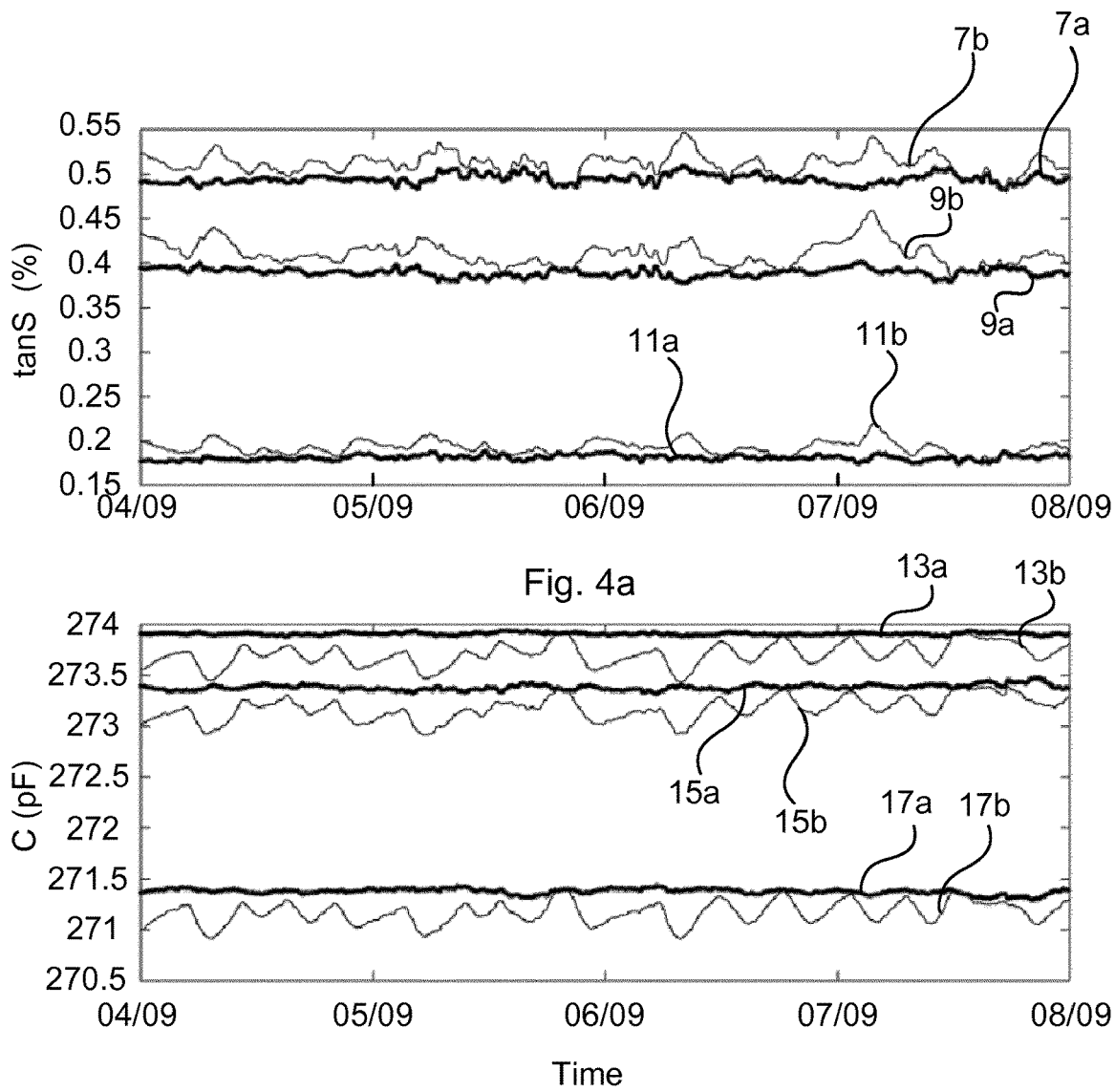
Fig. 4a
Fig. 4b
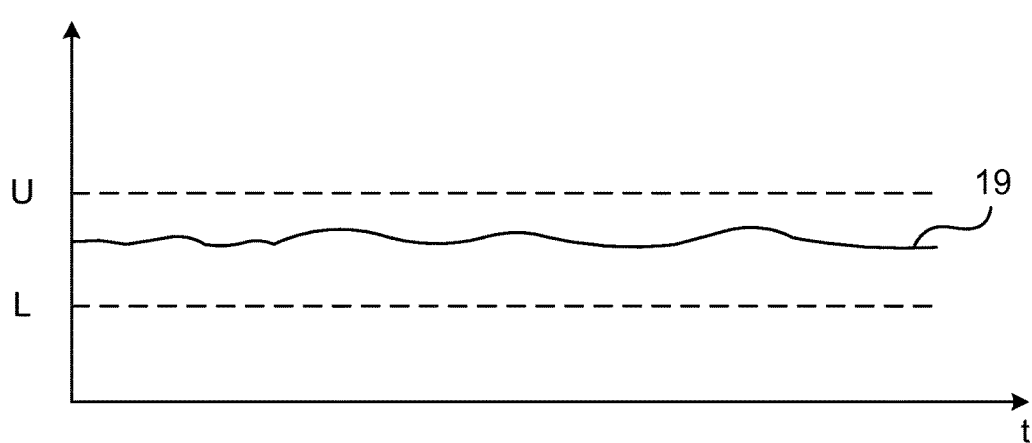
Fig. 5

METHOD AND DEVICE FOR DETERMINING CAPACITIVE COMPONENT PARAMETERS

TECHNICAL FIELD

The present disclosure generally relates to capacitive component parameter determination of an electrical power device. In particular, it relates to a method of determining the capacitance and the loss-factor of a plurality of capacitive components of an electrical power device.

BACKGROUND

There is a need for bushing monitoring due to the fact that bushing failures account for about 10% of transformer failures. There are a number of different methods of determining bushing parameters for assessing bushing status. One technique is generally referred to as the sum-current method, in which the bushing tap currents, from all the bushings of a transformer are measured and summed. As long as the vector sum is zero, it can typically be concluded that the bushings are functioning properly. If the vector sum is non-zero, it may typically be concluded that there is a bushing fault. This method is generally not temperature-dependent, because all the bushing capacitors are affected equally by temperature variations. However, if for example, the insulation of one of the bushings is damaged, that bushing may operate differently due to the local heat conditions. U.S. Pat. No. 6,177,803 discloses the sum-current method and mentions the possibility of temperature compensation in this case. The sum-current method is however sensitive to system voltage fluctuations and will never provide any values of the underlying individual bushing parameters such as the capacitance and loss-factor.

Another technique for bushing fault determination is based on comparing two bushings on the same phase. This method is termed "reference bushing method". Even if the reference bushing method is considered to be insensitive to system voltage fluctuations, it has been shown that the bushing parameters are influenced by the temperature difference between the two bushings forming part of a respective transformer due to different loading, cooling conditions, vintage, etc.

SUMMARY

In light of the above regarding the reference bushing method the present inventors have turned to the feasibility of estimating capacitance and loss factor of a plurality of bushings of a single transformer based on the bushing tap current and in-service voltage at the top of the bushing, often referred to as estimation of "absolute bushing parameters". This method is however unfortunately also sensitive to temperature variations.

In view of the above, an object of the present disclosure is to provide a method of determining capacitive component parameters of a plurality of capacitive components of an electrical power device, which solves, or at least mitigates, the problems of the prior art.

There is hence according to a first aspect of the present disclosure provided a method of determining the capacitance and loss-factor of each of a plurality of capacitive components of an electrical power device, wherein the method comprises: a) obtaining for each capacitive component a respective capacitance value and loss-factor value, and b) processing the capacitance values and the loss-factor values, wherein the processing involves removing a common influence of temperature on the capacitance values from the capacitance values and removing a common influence of temperature on the loss-factor values from the loss-factor values to obtain for each capacitive component a temperature-compensated capacitance value and a temperature-compensated loss-factor value.

An effect which may be obtainable thereby is the possibility to provide accurate on-line measurements of the capacitance and of the loss-factor of the capacitive components of the electrical device. The loss-factor is also commonly referred to as $\tan(\delta)$ and is related to the power-factor. The power-factor and loss-factor are essentially equal for small loss-factors, which is the case for capacitive applications, and could therefore be used interchangeably for this method.

The electrical power device may for example be an electrical reactor device such as an electromagnetic induction device e.g. a transformer, such as a power transformer, or a reactor, or a capacitive device such as a capacitor bank. A capacitive component, or capacitive device, may for example be condenser cores of a condenser bushing or capacitors of a capacitor bank.

According to one embodiment the common influence of temperature on the capacitance values and loss-factor values of the plurality of capacitive components is obtained based on a learning-period in which a plurality of capacitance values of each capacitive component and a plurality of loss-factor values of each capacitive component have been collected.

According to one embodiment the common influence of temperature on the capacitance is obtained based on statistical correlation analysis of the plurality of capacitance values collected in the learning-period.

According to one embodiment the common influence of temperature on the loss-factor is obtained based on statistical correlation analysis of the plurality of loss-factor values obtained in the learning-period.

The learning-period may for example amount to measurements obtained in an initial phase or period when the capacitor parameter determining device is being commissioned.

The method may be based on gradual learning, with the learning-period being ongoing continually, also while the method is being performed. The method may thereby be used essentially immediately without any prior learning-period in commissioning. The accuracy of the method will thereby gradually increase over time, as more and more capacitance values of each capacitive component and more and more loss-factor values of each capacitive component are collected.

According to one embodiment the processing involves transforming by means of a first eigenvector matrix a capacitance vector for which each element is a respective one of the capacitance values, to obtain a transformed capacitance vector, and transforming back the transformed capacitance vector with the inverse of an adjusted first eigenvector matrix to obtain an adjusted capacitance vector, which as its elements contains the temperature-compensated capacitance values.

According to one embodiment the first eigenvector matrix contains the eigenvectors of a first covariance matrix of a learning-period capacitance matrix containing for each capacitor a plurality of capacitance values obtained during a learning-period.

The first covariance matrix may be normalized and scaled prior to determining the first eigenvector matrix.

According to one embodiment the adjusted first eigenvector matrix has the elements of one of the eigenvectors set to zero.

According to one embodiment the eigenvector which has its elements set to zero is the eigenvector which corresponds to the largest eigenvalue. The largest eigenvalue represents the largest common variation among the capacitance values. The largest common variation is the temperature influence. By setting the corresponding eigenvector to zero in the adjusted first eigenvector matrix, the common influence of temperature of the capacitance values is removed when the transformed capacitance vector is transformed back using the inverse of the adjusted first eigenvector matrix.

According to one embodiment the processing involves transforming by means of a second eigenvector matrix a loss-factor vector for which each element is a respective one of the loss-factor values to obtain a transformed loss-factor vector, and transforming back the transformed vector loss-factor vector with the inverse of an adjusted second eigenvector matrix to obtain an adjusted loss-factor vector, which as its elements contains the temperature-compensated loss-factor values.

According to one embodiment the second eigenvector matrix contains the eigenvectors of a second covariance matrix of a learning-period loss-factor matrix containing for each bushing a plurality of loss-factor values obtained during a learning-period.

The second covariance matrix may be normalized and scaled prior to determining the second eigenvector matrix.

According to one embodiment the adjusted second eigenvector matrix has the elements of one of the eigenvectors set to zero.

According to one embodiment the eigenvector which has its elements set to zero is the eigenvector which corresponds to the largest eigenvalue. The largest eigenvalue represents the largest common variation among the loss-factor values. The largest common variation is the temperature influence. By setting the corresponding eigenvector to zero in the adjusted first eigenvector matrix, the common influence of temperature of the loss-factor values is removed when the transformed loss-factor vector is transformed back using the inverse of the adjusted first eigenvector matrix.

One embodiment comprises providing a respective upper and lower threshold value for each capacitance and each loss-factor, and in case any of the temperature-compensated capacitance values or temperature-compensated loss-factor values is outside the corresponding upper or lower threshold, generating an alarm.

According to one embodiment the obtaining involves determining a respective capacitance value and a respective loss-factor value based on a measurement of a respective bushing terminal voltage and a respective bushing tap current.

There is according to a second aspect of the present disclosure provided a computer program comprising computer-executable components which when run on processing circuitry of a capacitive component parameter determining device causes the capacitive component parameter determining device to perform the steps according to the method according to the first aspect.

There is according to a third aspect of the present disclosure provided a computer program product comprising a storage medium including a computer program according to the second aspect.

There is according to a fourth aspect of the present disclosure provided a capacitive component parameter determining device configured to determine the capacitance and loss-factor of each of a plurality of capacitive components of an electrical power device, wherein the capacitive component parameter determining device comprises: processing circuitry, and a storage medium comprising computer-executable components which when executed by the processing circuitry causes the capacitive component parameter determining device to perform the steps of the method according to the first aspect.

Generally, all terms used in the claims are to be interpreted according to their ordinary meaning in the technical field, unless explicitly defined otherwise herein. All references to "a/an/the element, apparatus, component, means, etc." are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which:

FIGS. 4a-4b schematically show graphs of loss-factor values and capacitance values, respectively, with and without temperature-compensation, plotted over time; and FIG. 5 schematically shows a graph of a bushing parameter, i.e. loss factor value or capacitance value, with upper and lower threshold values.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

The present disclosure relates to a method of determining the capacitance and the loss-factor of a plurality of capacitances of a single electrical power device. Hereto, the method is especially suitable for capacitive component parameter determination of an electrical power device comprising a plurality of capacitive components. In particular, the electrical power device is advantageously a poly-phase electrical power device, i.e. an electrical power device comprising a plurality of capacitive components with each capacitive component being associated with a respective electric phase.

The method involves obtaining a capacitance value of each capacitive component and a loss-factor value of each capacitive component. There is hence obtained a plurality of capacitance values and a plurality of loss-factor values, each capacitance value being associated with a respective one of the capacitive components and each loss-factor value being associated with a respective one of the capacitive components.

The capacitance values and the loss-factor values are processed to obtain for each capacitive component a temperature-compensated capacitance value and a temperature-compensated loss-factor value. The processing involves removing a common influence of temperature on the capacitance values from the capacitance values and removing a common influence of temperature on the loss-factor values from the loss-factor values. In this manner, the temperature-compensated capacitance values and the temperature-compensated loss-factor values can be obtained.

Since all capacitive components are provided on the same electrical power device, there will be a common influence of temperature on all capacitance values obtained and a common influence of temperature on all the loss-factor values obtained. The common influences on the capacitance values is removed from the capacitance values and the common influence on the loss-factors is removed from the loss-factor values.

Figure 1:
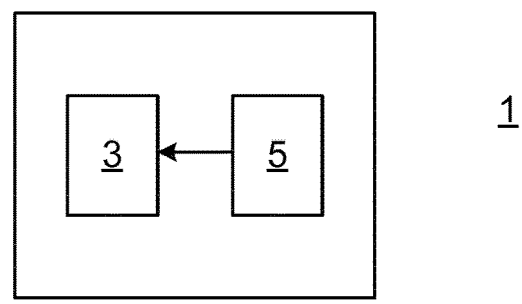
FIG. 1 schematically shows an example of a capacitive component parameter determining device.

A capacitive component parameter determining device configured to perform the method as disclosed herein will now be described with reference to FIG. 1. The exemplified capacitive component parameter determining device 1 comprises processing circuitry 3 and a storage medium 5. The storage medium 5 comprises computer-executable components which when run on the processing circuitry 3 causes the capacitive component parameter determining device 1 to perform the method as disclosed herein.

The processing circuitry 3 uses any combination of one or more of a suitable central processing unit (CPU), multiprocessor, microcontroller, digital signal processor (DSP), application specific integrated circuit (ASIC), field programmable gate arrays (FPGA) etc., capable of executing any herein disclosed operations concerning bushing parameter determination.

The storage medium 5 may for example be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory.

A capacitive component as referred to herein may for example be a condenser core of a bushing of an electrical power device, or a capacitor of a capacitor bank.

Figure 2:
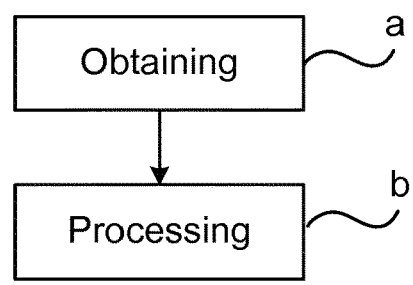
FIG. 2 shows a flowchart of a method carried out by the capacitive component parameter determining device in FIG. 1.

FIG. 2 shows a method of determining the capacitance and loss-factor of each of a plurality of capacitive components of an electrical power device.

In a step a) for each capacitive component of the electrical device a respective capacitance value and a respective loss-factor value is obtained by the processing circuitry 3.

In case of a bushing provided with a condenser core, each capacitance value and loss factor value may for example be obtained based on measurements of the respective bushing terminal voltage and a respective bushing tap current. The capacitance values and the loss-factor values may be estimated based on the respective bushing terminal voltage and bushing tap current.

Figure 3:
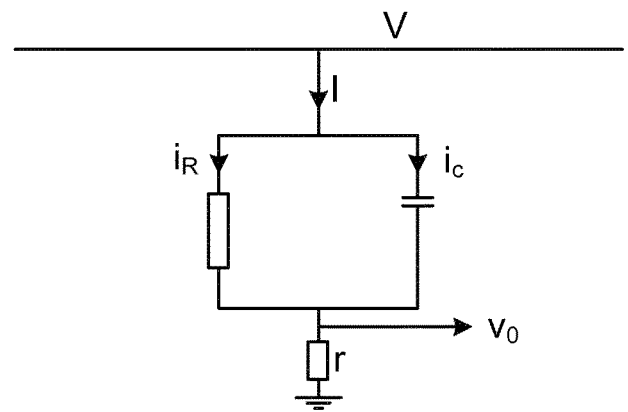
FIG. 3 shows a measurement set-up for obtaining capacitance values and loss-factor values of capacitive components of an electrical power device.

FIG. 3 shows an example of a set-up which provides measurement of a bushing terminal voltage V and bushing tap current I. The bushing terminal voltage V may for example be obtained using a voltage transformer. The complex admittance Y of a bushing is equal to the bushing tap current I divided by the bushing terminal voltage, i.e. Y=I/V, and each capacitance value may be estimated by dividing the imaginary part of the complex admittance with the angular frequency of the system, i.e. $C=Im(Y)/\omega$. The loss-factor, or tan(δ), may be estimated by dividing the real part of the complex admittance with the complex part of the complex admittance, i.e. Re(Y)/Im(Y), which is equivalent to $i_r/i_c$, i.e. $tan(\delta)=i_r/i_c$.

In a step b) the capacitance values and the loss-factor values are processed by means of the processing circuitry 3. The processing involves removing a common influence of temperature on the capacitance values from the capacitance values and removing a common influence of temperature on the loss-factor values. In this manner, a temperature-compensated capacitance value and a temperature-compensated loss-factor value is obtained for each capacitive component.

According to one example the common influence of temperature on the capacitance values and the common influence of temperature on the loss-factor values are derived from plurality of capacitance values of each capacitive component and a plurality of loss-factor values of each capacitive component, collected during a learning-period before commencement of the present method. In particular, statistical correlation analysis may be carried out on this data set, i.e. on the capacitance values and loss-factor values collected in the learning-period, whereby the common influence of temperature on the capacitance values and the common influence of temperature on the loss-factor values may be determined. Hereto, the common influences on temperature are typically predetermined and are thus ready to be applied in step b).

According to one example, this statistical correlation analysis may involve using Principal Component Analysis (PCA) as will be described in more detail in the following. It should be noted that other statistical correlation analysis methods may alternatively be employed on the plurality of capacitance values and loss-factor values collected in the learning-period, for example statistical regression-based methods.

In the case of PCA, the processing in step b) involves transforming by means of a first eigenvector matrix $V_c$ a capacitance vector $x_c$ for which each element is a respective one of the capacitance values obtained in step a), to obtain a transformed capacitance vector $y_c$. A transformation of the type $V_c^* x_c = y_c$ is hence performed, where the columns of the first eigenvector matrix $V_c$ are eigenvectors of a first covariance matrix $X_{cco}$ of a learning-period capacitance matrix $X_c$ obtained during a learning-period. In particular, the learning-period capacitance matrix $X_c$ contains a plurality of capacitance values of each capacitive component, obtained during the learning-period. As an example, the first eigenvector matrix may be a 3*3 matrix $V_c$=[V1c V2c V3c] in case the electromagnetic induction device has three electrical phases and thus three capacitive components, with V1c-V3c being the eigenvectors arranged as columns, and $x=(c_1, c_2, c_3)$ is a vector containing three components c1-c3 which are the three capacitance values obtained in step a).

The transformed capacitance vector $y_c$ is then transformed back with the inverse of an adjusted first eigenvector matrix $V_c'$ to obtain an adjusted capacitance vector $x_c'$, which as its elements contains the temperature-compensated capacitance values. Hereto, a transformation $(V_c')^{-1} y_c = x_c'$ is performed where $x_c'=(c_1', c_2', c_3')$ contains the temperature-compensated capacitance values.

The adjusted first eigenvector matrix $V_c'$ has the elements of one of the eigenvectors set to zero. In particular, the eigenvector which has its elements set to zero is the eigenvector which corresponds to the largest eigenvalue or singular value, so in the general n-capacitive component case the adjusted first eigenvector matrix is $V_c'$=(0 Vc2 . . . Vcn), and in the example with three capacitive components the adjusted first eigenevector matrix $V_c' = (0\ Vc2\ Vc3)$.

Since the capacitance matrix $X_c$ is typically an m*n matrix, where m≠n, diagonalization of its covariance matrix, i.e. the first covariance matrix $X_{cco}$, is not possible and to this end other factorization methods may be used to obtain the "eigenvalues" of the first covariance matrix $X_{cco}$. Singular Value Decomposition (SVD) may for example be used to obtain the first eigenvector matrix $V_c$.

As noted above, the learning-period capacitance matrix $X_c$ for the capacitance values contains a plurality of capacitance values of each capacitive component collected during the learning-period, and the capacitive component matrix may in the event of a three-phase system be of the form $X_c = (Xc1\ Xc2\ Xc3)$, and in more general $X_c = (Xc1 \ldots Xcn)$, where Xck is a column vector with m elements, each being a capacitance value of the k:th capacitive component obtained during the learning-period.

It may also be noted that the learning-period capacitance matrix $X_c$ may be normalized and scaled before the first covariance matrix $X_{cco}$ is determined. The normalization may involve taking the mean of each column and subtracting the mean of a column from the elements of a column. The scaling may for example involve dividing the elements in each column with the standard deviation of the elements in the column.

The processing in step b) further involves transforming by means of a second eigenvector matrix $V_{tan(\delta)}$ a loss-factor vector $x_{tan(\delta)}$ for which each element is a respective one of the loss-factor values obtained in step a), to obtain a transformed loss-factor vector $y_{tan(\delta)}$. A transformation of the type $V_{tan(\delta)}*x_{tan(\delta)} = y_{tan(\delta)}$ is hence performed, where the columns of the second eigenvector matrix $V_{tan(\delta)}$ are eigenvectors of a second covariance matrix $X_{tan(\delta)co}$ of a learning-period loss-factor matrix $X_{tan(\delta)}$ obtained during a learning-period. In particular, the learning-period loss-factor matrix $X_{tan(\delta)}$ contains a plurality of loss-factor values of each capacitive component, obtained during the learning-period. As an example, the second eigenvector matrix may be a 3*3 matrix $V_{tan(\delta)} = [V1_{tan(\delta)}\ V2_{tan(\delta)}\ V3_{tan(\delta)}]$ in case the electromagnetic induction device has three electrical phases and thus three capacitive components, with $V1_{tan(\delta)}$-$V3_{tan(\delta)}$ being the eigenvectors arranged as columns, and $x_{tan(\delta)} = (\tan(\delta)_1, \tan(\delta)_2, \tan(\delta)_3)$ is a vector containing three components $\tan(\delta)1$-$\tan(\delta)3$ which are the three loss-factor values obtained in step a).

The transformed loss-factor vector $y_{tan(\delta)}$ is then transformed back with the inverse of an adjusted second eigenvector matrix $V_{tan(\delta)}'$ to obtain an adjusted loss-factor vector $x_{tan(\delta)}'$, which as its elements contains the temperature-compensated loss-factor values. Hereto, a transformation $(V_{tan(\delta)}')^{-1}y_{tan(\delta)} = x_{tan(\delta)}'$ is performed where $x_{tan(\delta)}' = (\tan(\delta)_1', \tan(\delta)_2', \tan(\delta)_3')$ contains the temperature-compensated loss-factor values.

The adjusted second eigenvector matrix $V_{tan(\delta)}'$ has the elements of one of the eigenvectors set to zero. In particular, the eigenvector which has its elements set to zero is the eigenvector which corresponds to the largest eigenvalue or singular value, so in the general n-capacitive component case the adjusted second eigenvector matrix is $V_{tan(\delta)}' = (0\ V\tan(\delta)2 \ldots V\tan(\delta)n)$, and in the example with three capacitive components $V_{tan(\delta)}' = (0\ V\tan(\delta)2\ V\tan(\delta)3)$.

Since the learning-period loss-factor matrix $X_{tan(\delta)}$ is typically an m*n matrix, where m≠n, diagonalization of its covariance matrix, i.e. the second covariance matrix $X_{tan(\delta)co}$, is not possible and to this end other factorization methods may be used to obtain the "eigenvalues" of the second covariance matrix $X_{tan(\delta)co}$. Singular Value Decomposition (SVD) may for example be used to obtain the second eigenvector matrix $V_{tan(\delta)}$.

As previously noted, the learning-period loss-factor matrix $X_{tan(\delta)}$ for the loss-factor values may contain a plurality of loss-factor value of each capacitive component collected during the learning-period, and the learning-period loss-factor matrix may in the event of a three-phase system be of the form $X_{tan(\delta)} = (X\tan(\delta)1\ X\tan(\delta)2\ X\tan(\delta)3)$, and in more general $X_{tan(\delta)} = (X\tan(\delta)1 \ldots X\tan(\delta)n)$, where $X\tan(\delta)k$ is a column vector with m items, each being a loss-factor value of the k:th capacitive component obtained during the learning-period.

It may also be noted that the learning-period loss-factor matrix $X_{tan(\delta)}$ may be normalized and scaled before the second covariance matrix $X_{tan(\delta)co}$ is determined. The normalization may involve taking the mean of each column and subtracting the mean of a column from the elements of the column. The scaling may for example involve dividing the elements in each column with the standard deviation of the elements in the column.

FIGS. 4a and 4b show examples of the temperature-compensated loss-factor values versus the non-compensated originally obtained loss-factor values, i.e. those obtained in step a) but without the processing of step b), and the temperature-compensated capacitance values versus the non-compensated capacitance values in the context of bushings.

In FIG. 4a the loss-factor values are shown in a graph for each of three bushings of an electromagnetic induction device. Curves 7a, 9a, and 11a show the temperature-compensated loss-factor values of three bushings over time, while curves 7b, 9b, and 11b show the corresponding non-compensated loss-factor values. As can be seen, the temperature-compensated loss-factor value curves 7a-11a are much less prone to fluctuations and provide a good measure of the actual absolute loss-factor values of the bushings. Similarly, in FIG. 4b, the capacitance values are shown in a graph for each of three bushings of an electrical power device. Curves 13a, 15a, and 17a show the temperature-compensated capacitance values of the three bushings over time, while curves 13b-17b show the corresponding non-compensated capacitance values.

Since the temperature-compensated loss-factor values and capacitance values provide accurate estimations of the loss factor and capacitance of the bushings, these values may be used to determine whether there is a capacitance fault or electrical power device fault present. Thus, according to one example, there may be provided a respective upper threshold value U and lower threshold value L for each capacitance and each loss-factor, as shown in FIG. 5 for only one capacitance parameter, i.e. plot 19 which shows one of the two capacitive component parameters discussed herein. The upper and lower threshold values U and L provide a range for each capacitive component and for each capacitive component parameter, within which the capacitance value or loss-factor is allowed to vary. In case any of the temperature-compensated capacitance values or temperature-compensated loss-factor values are outside the corresponding upper or lower threshold an alarm may be generated to thereby alert an operator that a fault is present.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of determining the capacitance and loss-factor of each of a plurality of capacitive components of an electrical power device, wherein the method comprises:
   obtaining, by a processor circuit, a respective capacitance value for each capacitive component;
   obtaining, by the processor circuit, a respective loss-factor value for each capacitive component;
   removing, by the processor circuit, a common influence of temperature on the capacitance values from the capacitance values to obtain for each capacitive component a temperature-compensated capacitance value;
   removing, by the processor circuit, a common influence of temperature on the loss-factor values from the loss-factor values to obtain for each capacitive component a temperature-compensated loss-factor value;
   transforming, by the processor circuit using a first eigenvector matrix, a capacitance vector to obtain a transformed capacitance vector,
      wherein each element of the capacitance vector is a respective one of the capacitance values, and
      wherein the first eigenvector matrix includes eigenvectors of a first covariance matrix of a learning-period capacitance matrix that includes, for each capacitive component, a plurality of capacitance values obtained during a learning-period;
   transforming, by the processor circuit using an inverse of an adjusted first eigenvector matrix, the transformed capacitance vector to obtain an adjusted capacitance vector,
      wherein elements of the adjusted capacitance vector include the temperature-compensated capacitance values,
      wherein the elements of a first eigenvector of the adjusted first eigenvector matrix are set to zero, and
      wherein the first eigenvector corresponds to the largest eigenvalue of the adjusted first eigenvector matrix;
   determining, by the processor circuit, whether a fault is present based on at least one of the temperature-compensated capacitance values or the temperature-compensated loss-factor values; and
   generating, by the processor circuit based on a determination that a fault is present, an alert to alert a user that the fault is present.

2. The method as claimed in claim 1, wherein the common influence of temperature on the capacitance values and the loss-factor values of a plurality of bushings is obtained based on a learning-period in which a plurality of capacitance values of each capacitive component and a plurality of loss-factor values of each capacitive component have been collected.

3. The method as claimed in claim 2, wherein the common influence of temperature on the capacitance is obtained based on statistical correlation analysis of the plurality of capacitance values collected in the learning-period.

4. The method as claimed in claim 2, wherein the common influence of temperature on the loss-factor is obtained based on statistical correlation analysis of the plurality of loss-factor values obtained in the learning-period.

5. The method as claimed in claim 1, further comprising:
   transforming, by the processor circuit using a second eigenvector matrix, a loss-factor vector to obtain a transformed loss-factor vector, wherein each element of the second eigenvector matrix is a respective one of the loss-factor values; and
   transforming, by the processor circuit using an inverse of an adjusted second eigenvector matrix, the transformed loss-factor vector to obtain an adjusted loss-factor vector, wherein elements of the adjusted loss-factor vector include the temperature-compensated loss-factor values.

6. The method as claimed in claim 5, wherein the second eigenvector matrix includes eigenvectors of a second covariance matrix of a learning-period loss-factor matrix that includes, for each capacitive component, a plurality of loss-factor values obtained during a learning-period.

7. The method as claimed in claim 5, wherein the elements of a second eigenvector of the adjusted second eigenvector matrix are set to zero.

8. The method as claimed in claim 7, wherein the second eigenvector corresponds to the largest eigenvalue of the adjusted second eigenvector matrix.

9. The method as claimed in claim 1, further comprising:
   determining, by the processor circuit, a capacitance threshold range,
   wherein determining whether the fault is present is further based on determining that at least one of the temperature-controlled capacitance values is outside the capacitance threshold range.

10. A computer program product comprising computer-executable components on a non-transitory computer readable storage medium which, when executed by a processor circuit of a capacitive component parameter determining device, causes the capacitive component parameter determining device to perform the operations including:
    obtaining, by the processor circuit, a respective capacitance value for each capacitive component;
    obtaining, by the processor circuit, a respective loss-factor value for each capacitive component;
    removing, by the processor circuit, a common influence of temperature on the capacitance values from the capacitance values to obtain for each capacitive component a temperature-compensated capacitance value;
    removing, by the processor circuit, a common influence of temperature on the loss-factor values from the loss-factor values to obtain for each capacitive component a temperature-compensated loss-factor value;
    transforming, by the processor circuit using a first eigenvector matrix a capacitance vector to obtain a transformed capacitance vector,
       wherein each element of the capacitance vector is a respective one of the capacitance values, and
       wherein the first eigenvector matrix includes eigenvectors of a first covariance matrix of a learning-period capacitance matrix that includes, for each capacitive component, a plurality of capacitance values obtained during a learning-period;
    transforming, by the processor circuit using an inverse of an adjusted first eigenvector matrix, the transformed capacitance vector to obtain an adjusted capacitance vector,
       wherein elements of the adjusted capacitance vector include the temperature-compensated capacitance values,
       wherein the elements of a first eigenvector of the adjusted first eigenvector matrix has the elements of one of the eigenvectors set to zero, and
       wherein the first eigenvector corresponds to the largest eigenvalue of the adjusted first eigenvector matrix;
    determining, by the processor circuit, whether a fault is present based on at least one of the temperature-compensated capacitance values or the temperature-compensated loss-factor values; and generating, by the processor circuit based on a determination that a fault is present, an alert to alert a user that the fault is present.

11. A capacitive component parameter determining device configured to determine the capacitance and loss-factor of each of a plurality of capacitive components of an electrical power device, wherein the capacitive component parameter determining device comprises:

a processor circuit, and a storage medium including computer-executable components which, when executed by the processor circuit, causes the capacitive component parameter determining device to perform operations including:

obtaining, by the processor circuit, a respective capacitance value for each capacitive component;

obtaining, by the processor circuit, a respective loss-factor value for each capacitive component;

removing, by the processor circuit, a common influence of temperature on the capacitance values from the capacitance values to obtain for each capacitive component a temperature-compensated capacitance value;

removing, by the processor circuit, a common influence of temperature on the loss-factor values from the loss-factor values to obtain for each capacitive component a temperature-compensated loss-factor value;

transforming, by the processor circuit using a first eigenvector matrix a capacitance vector to obtain a transformed capacitance vector, wherein each element of the capacitance vector is a respective one of the capacitance values, and wherein the first eigenvector matrix includes eigenvectors of a first covariance matrix of a learning-period capacitance matrix that includes, for each capacitive component, a plurality of capacitance values obtained during a learning-period;

transforming, by the processor circuit using an inverse of an adjusted first eigenvector matrix, the transformed capacitance vector to obtain an adjusted capacitance vector, wherein elements of the adjusted capacitance vector include the temperature-compensated capacitance values, wherein the elements of a first eigenvector of the adjusted first eigenvector matrix has the elements of one of the eigenvectors set to zero, and wherein the first eigenvector corresponds to the largest eigenvalue of the adjusted first eigenvector matrix;

determining, by the processor circuit, whether a fault is present based on at least one of the temperature-compensated capacitance values or the temperature-compensated loss-factor values; and generating, by the processor circuit based on a determination that a fault is present, an alert to alert a user that the fault is present.

12. The method as claimed in claim 1, wherein the electrical power device comprises a transformer.

13. The method as claimed in claim 1, wherein the fault comprises at least one of a capacitance fault or an electrical power device fault.

14. The method as claimed in claim 13, wherein the fault comprises a bushing fault.

15. The computer program as claimed in claim 10, wherein each capacitive component comprises a condenser core of a bushing of an electrical power device.

16. The capacitive component parameter determining device as claimed in claim 11, wherein the electrical power device comprises a transformer.

17. The method as claimed in claim 1, further comprising:
determining, by the processor circuit, a loss-factor threshold range, wherein determining whether the fault is present is further based on determining that at least one of the temperature-controlled loss-factor values is outside the loss-factor threshold range.

18. The method as claimed in claim 1, wherein the plurality of capacitive components comprise a plurality of bushings, and wherein obtaining the respective capacitance values and the respective loss-factor values comprises, for each bushing:

determining, by the processor circuit, a bushing terminal voltage (V) and a bushing tap current (I);

determining, by the processor circuit, a complex admittance (Y) of the bushing, wherein Y=I/V;

dividing, by the processor circuit, an imaginary part of the complex admittance by an angular frequency ($\omega$) of the electrical power device to obtain the capacitance value (C), wherein C=Im(Y)/$\omega$; and dividing, by the processor circuit, a real part of the complex admittance by the imaginary part of the complex admittance to obtain the loss-factor value (tan($\delta$)), wherein tan($\delta$)=Re(Y)/Im(Y).

* * * * *